United States Patent
Iwamoto

(10) Patent No.: US 10,483,236 B2
(45) Date of Patent: Nov. 19, 2019

(54) SEMICONDUCTOR DEVICE

(71) Applicant: Toshiba Memory Corporation, Tokyo (JP)

(72) Inventor: Masaji Iwamoto, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 6 days.

(21) Appl. No.: 15/693,370

(22) Filed: Aug. 31, 2017

(65) Prior Publication Data

US 2018/0277514 A1    Sep. 27, 2018

(30) Foreign Application Priority Data

Mar. 22, 2017 (JP) ................. 2017-056212

(51) Int. Cl.
*H01L 25/065* (2006.01)
*H01L 23/498* (2006.01)
(Continued)

(52) U.S. Cl.
CPC .......... *H01L 25/0657* (2013.01); *G11C 5/025* (2013.01); *G11C 5/063* (2013.01); *G11C 7/04* (2013.01); *G11C 29/12* (2013.01); *G11C 29/48* (2013.01); *H01L 23/49816* (2013.01); *H01L 23/49838* (2013.01); *G11C 2029/0401* (2013.01); *G11C 2029/1206* (2013.01); *H01L 23/3128* (2013.01); *H01L 23/49827* (2013.01); *H01L 23/562* (2013.01); *H01L 24/48* (2013.01); *H01L 2224/48091* (2013.01); *H01L 2224/48106* (2013.01); *H01L 2224/48147* (2013.01);
(Continued)

(58) Field of Classification Search
USPC ........................................................... 257/48
See application file for complete search history.

(56) References Cited

U.S. PATENT DOCUMENTS 8,395,404 B2    3/2013  Kaku
8,618,827 B2 *  12/2013  Shao ................. G01R 31/2648
                                                    324/71.5
(Continued)

FOREIGN PATENT DOCUMENTS

JP    2010278212 A    12/2010
JP    2013080750 A    5/2013
JP    5262945 B2    8/2013

*Primary Examiner* — Zandra V Smith
*Assistant Examiner* — Lawrence C Tynes, Jr.
(74) *Attorney, Agent, or Firm* — Kim & Stewart LLP

(57) ABSTRACT

A semiconductor device includes a substrate having first and second principal surfaces, and a semiconductor chip disposed on the first principal surface. The substrate includes a first conductor layer disposed on the first principal surface, a second conductor layer disposed on the second principal surface, at least one third conductive layer between the first conductive layer and the second conductive layer, a detection interconnection disposed in either the first conductive layer or the third conductive layer, and first and second pads disposed on the second conductive layer and connected to the detection interconnection. The detection interconnection is not part of signal interconnections that are used during operation of the semiconductor chip and is not electrically connected to any circuit of the semiconductor chip.

18 Claims, 5 Drawing Sheets

(51) Int. Cl.
  *G11C 29/12* (2006.01)
  *H01L 23/00* (2006.01)
  *G11C 5/02* (2006.01)
  *G11C 5/06* (2006.01)
  *G11C 7/04* (2006.01)
  *G11C 29/48* (2006.01)
  G11C 29/04 (2006.01)
  H01L 23/31 (2006.01)

(52) U.S. Cl.
  CPC ............... *H01L 2224/48227* (2013.01); *H01L 2225/0651* (2013.01); *H01L 2225/06506* (2013.01); *H01L 2225/06548* (2013.01); *H01L 2225/06562* (2013.01); *H01L 2225/06586* (2013.01); *H01L 2225/06596* (2013.01); *H01L 2924/1438* (2013.01); *H01L 2924/3512* (2013.01)

(56) References Cited

U.S. PATENT DOCUMENTS

| 9,466,562 | B2* | 10/2016 | Nakazawa | H01L 23/5226 |
| 2017/0040306 | A1* | 2/2017 | Kim | H01L 25/167 |
| 2017/0125360 | A1* | 5/2017 | Lee | H01L 23/573 |

\* cited by examiner

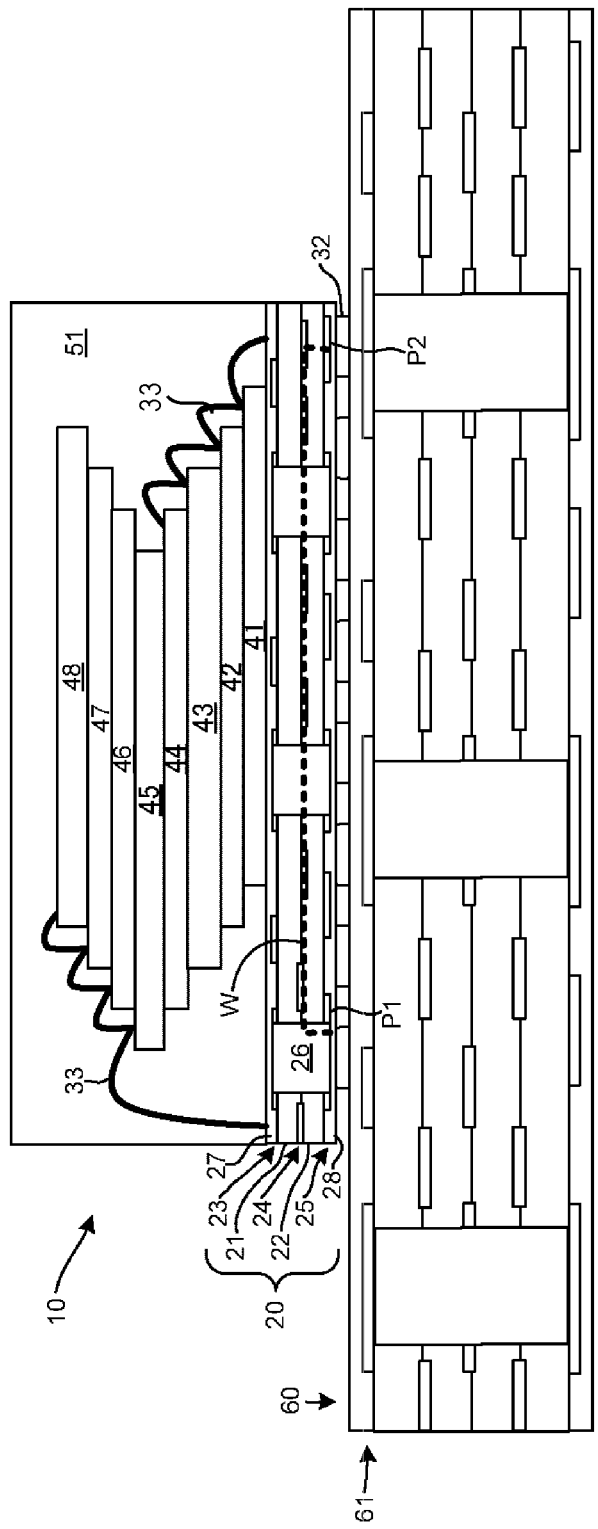

SEMICONDUCTOR DEVICE

CROSS-REFERENCE TO RELATED APPLICATION

This application is based upon and claims the benefit of priority from Japanese Patent Application No. 2017-056212, filed Mar. 22, 2017, the entire contents of which are incorporated herein by reference.

FIELD

Embodiments described herein relate generally to a semiconductor device.

BACKGROUND

A stacked memory package is configured such that memory chips (which are memory devices) are stacked and encapsulated with a mold resin, and is used while being mounted on a board.

After the stacked memory package is mounted and starts to be used, an interconnection in the stacked memory package may be broken, which results in that the stacked memory package cannot be driven. In this case, data stored in the stacked memory package cannot be read and the data is lost.

DESCRIPTION OF THE DRAWINGS

FIG. 5 is a cross-sectional view illustrating a state of mounting the semiconductor device according to the modified embodiment.

DETAILED DESCRIPTION

Embodiments provide a semiconductor device capable of detecting a condition of the semiconductor device that indicates it might become inoperable before it actually becomes inoperable.

In general, according to one embodiment, a semiconductor device includes a substrate having first and second principal surfaces, and a semiconductor chip disposed on the first principal surface. The substrate includes a first conductor layer disposed on the first principal surface, a second conductor layer disposed on the second principal surface, at least one third conductive layer between the first conductive layer and the second conductive layer, a detection interconnection disposed in either the first conductive layer or the third conductive layer, and first and second pads disposed on the second conductive layer and connected to the detection interconnection. The detection interconnection is not part of signal interconnections that are used during operation of the semiconductor chip and is not electrically connected to any circuit of the semiconductor chip.

Embodiments will be described hereinafter in detail with reference to the drawings.

First Embodiment

Figure 1:
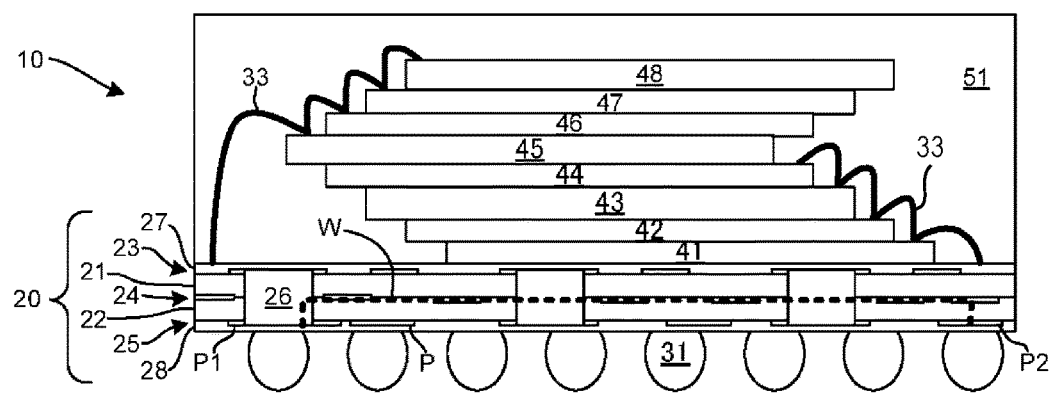
FIG. 1 is a cross-sectional view illustrating a semiconductor device according to an embodiment.

As shown in FIG. 1, a semiconductor device 10 includes an interconnection substrate 20, external terminals 31, connection members 33, memory chips 41 to 48, and a mold resin layer 51.

The interconnection substrate 20, which is a generally rectangular substrate having four sides, functions as a substrate that has first and second principal surfaces. Upper and lower surfaces of the interconnection substrate 20 correspond to the first and second principal surfaces, respectively.

The interconnection substrate 20 includes insulating layers 21 and 22, interconnection layers 23 to 25, through-holes 26, and resist layers 27 and 28.

The insulating layers 21 and 22 are made of, for example, an insulator such as a glass-epoxy resin.

The interconnection layers 23 to 25 (top, inner, and bottom layers) each include a plurality of interconnections using, for example, Cu or Al and are each disposed between the insulating layers 21 and 22, on the insulating layer 21, or under the insulating layer 22.

The interconnection layer 23 is a conductive layer at the first principal surface and is referred to herein as the first conductive layer. The interconnection layer 25 is a conductive layer at the second principal surface and is referred to herein as the second conductive layer. The interconnection layer 24 is a conductive layer disposed between the first and second conductive layers and is referred to herein as the third conductive layer.

Here, the three interconnection layers 23 to 25 are separated by the two insulating layers 21 and 22. Alternatively, four or more interconnection layers may be disposed and separated by three or more insulating layers. In this case, a plurality of interconnection layers 24 each serving as an inner conductive layer, is provided.

The interconnection layer 24 includes a detection interconnection W, and the interconnection layer 25 includes signal pads (e.g., lands) P and detection pads P1 and P2. The pads P, P1, and P2 are connected to the external terminals 31.

The pads P1 and P2 are disposed on the second conductive layer and connected to the interconnections.

The pads P are disposed in the second conductive layer and connected to the semiconductor chips.

The through-holes 26 are formed from a conductor and serve as interlayer connection sections connecting the interconnection layers 23 to 25.

The resist layers 27 and 28 are resin layers (for example, epoxy resin layers) that are disposed on an outer surface of the interconnection layers 23 and 25 to protect the interconnection layers 23 and 25, respectively.

The external terminals 31 are terminals that are, for example, conductive bumps for connecting the semiconductor device 10 to a mounting substrate 60. The external terminals 31 are disposed on the lower surface of the interconnection substrate 20 and connected to the pads P on the interconnection layer 25. The external terminals 31 are disposed on the second principal surface.

Here, as shown in FIG. 1, the semiconductor device 10 is shown to have a BGA (Ball Grid Array). The BGA includes solder balls and electrically and mechanically connects the interconnection substrate 20 to the mounting substrate 60 by being molten and solidified.

The connection members 33 are conductive members, for example, conductive wires for electrically connecting the interconnection layer 23 to the memory chips 41 to 48.

The memory chips 41 to 48 are, for example, NAND flash memory semiconductor chips for writing and reading data.

The memory chips 41 to 48 function as the semiconductor chips disposed on the first principal surface.

Stacking the memory chips 41 to 48 on the interconnection substrate 20 is intended to increase a memory capacity per area of the interconnection substrate 20. The memory chips 41 to 48 each include a terminal (not shown) on an upper surface thereof for electrical connection to outside. The connection members 33 are connected to these terminals.

The mold resin layer 51 contains a resin material and an inorganic filler, encapsulates the interconnection layer 23, the connection members 33, and the memory chips 41 to 48 to protect the interconnection layer 23, the connection members 33, and the memory chips 41 to 48.

Figure 2:
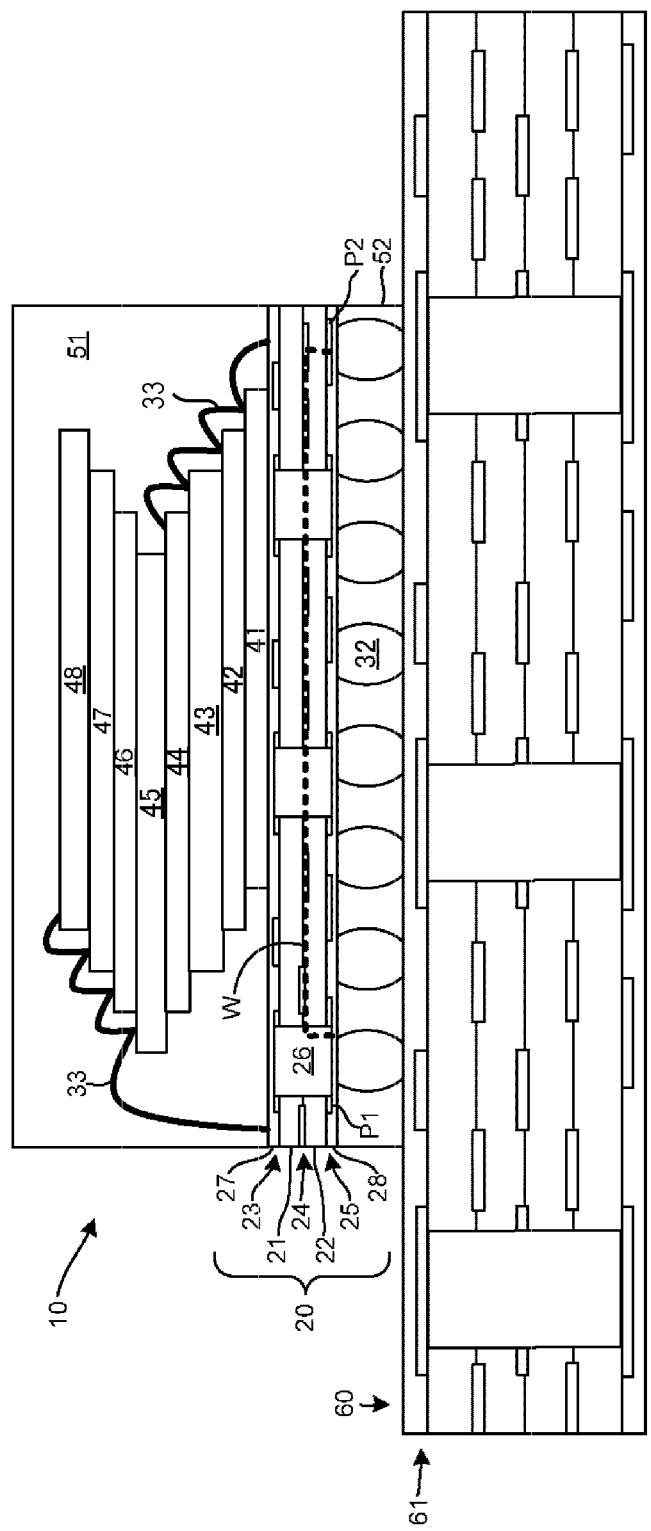
FIG. 2 is a cross-sectional view illustrating a state of mounting the semiconductor device according to the embodiment.

As shown in FIG. 2, the semiconductor device 10 is used while being connected to the mounting substrate 60. The external terminals 31 (solder balls in this embodiment) are molten and solidified to become solder joint portions 32, and the solder joint portions 32 electrically and mechanically connect the interconnection layer 25 of the semiconductor device 10 to an interconnection layer 61 of the mounting substrate 60.

An underfill layer 52 is disposed between the semiconductor device 10 and the mounting substrate 60 as needed, to encapsulate and protect the solder joint portions 32. The underfill layer 52 is made of a resin material (for example, an epoxy resin).

Figure 3:
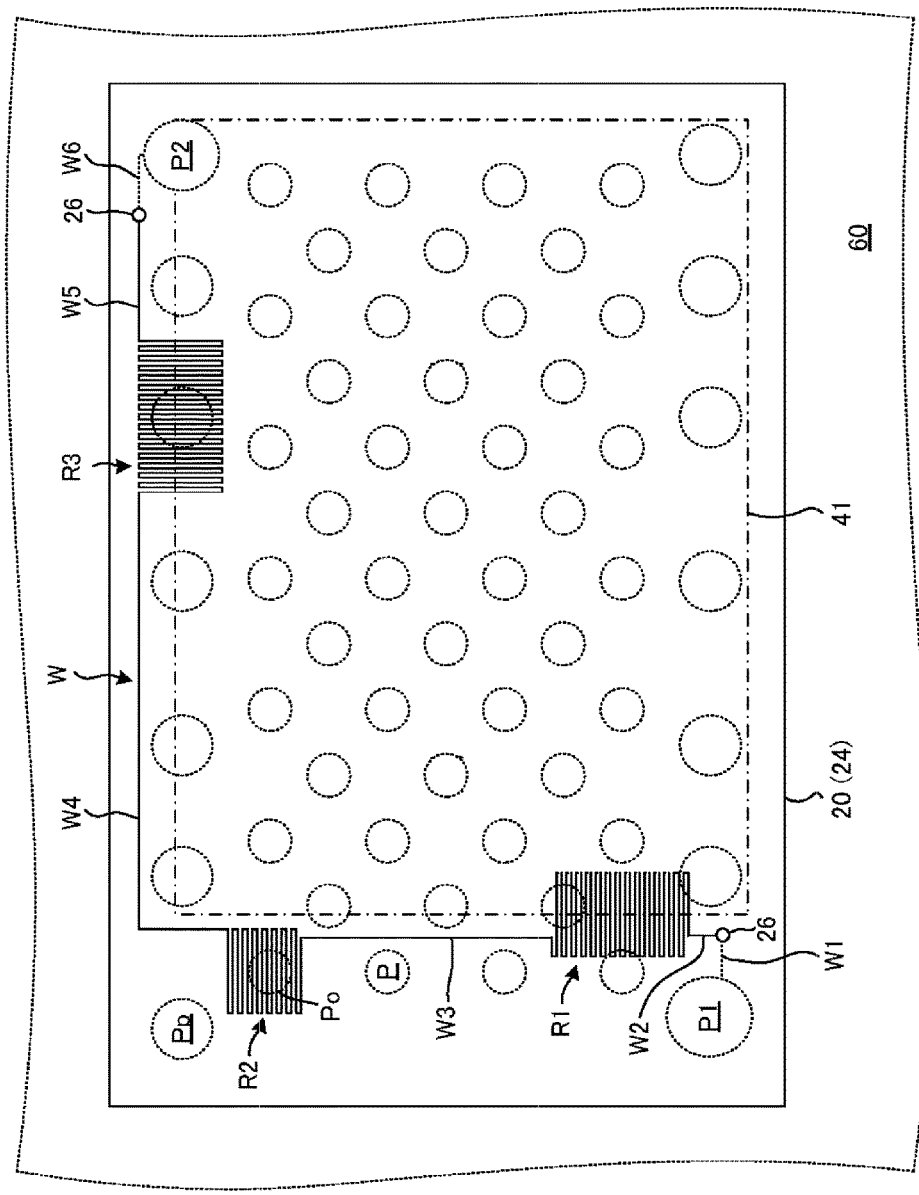
FIG. 3 is a pattern diagram of a detection interconnection W detecting occurrence of cracking in a substrate.

Detection of cracking in the interconnection substrate 20 by the detection interconnection W will be described below in detail. FIG. 3 is a plan view illustrating, from an upper surface, a state of mounting the semiconductor device 10 including the interconnection substrate 20, the memory chip 41, and the like on the mounting substrate 60.

In FIG. 3, the elements, the detection interconnection W and the through-holes 26, that are on the interconnection layer 24, are represented by solid lines. The elements, the pads P, P1, and P2 on the interconnection layer 25, that are below the interconnection layer 24 are represented by broken lines, and the element, memory chip 41, that is above the interconnection layer 24 is represented by a dashed-dotted line.

The detection interconnection W includes serpentine regions R1 to R3, detection interconnections W1 to W6, and the through-holes 26, with both ends of the detection interconnection W being connected to the pads P1 and P2. The detection interconnection W is disposed in the first or third conductive layer, has the serpentine regions R1 to R3 where the interconnections zigzag multiple times, and corresponds to a detection interconnection that is not used for operation of the semiconductor chips.

By inspecting the conduction (for example, measuring a resistance value) between the pads P1 and P2, it is possible to detect a sign that the semiconductor device 10 might be becoming inoperable (e.g., as a result of cracking in the substrate 20).

The pad P1, the detection interconnection W1, the through-hole 26, the detection interconnection W2, the serpentine region R1, the detection interconnection W3, the serpentine region R2, the detection interconnection W4, the serpentine region R3, the detection interconnection W5, the through-hole 26, the detection interconnection W6, and the pad P2 are electrically connected in this order.

Among these, the pads P1 and P2 and the detection interconnections W1 and W6 are disposed on the interconnection layer 25. The serpentine regions R1 to R3 and the detection interconnections W2 to W5 are disposed on the interconnection layer 24. The through-holes 26 in the detection interconnection W extend over the interconnection layers 24 and 25.

While the detection interconnection W is disposed directly over a part of the pads P, which are different from the pads P1 and P2, the detection interconnection W is not electrically connected to the pads P because the detection interconnection W is disposed on the different interconnection layer from the interconnection layer on which the pads P are disposed.

The detection interconnection W and the pads P1 and P2 are not used as signal interconnection for the memory chips 41 to 48 to operate (and are thus not electrically connected to the memory chips 41 to 48). That is, even when the detection interconnection W is broken, the broken detection interconnection W has no influence on the operation of the memory chips 41 to 48. Because of this, in a state in which the semiconductor device 10 is still operable, it is possible to detect that the detection interconnection W is broken but be able to read and save data stored in the semiconductor device 10 before the semiconductor device 10 actually becomes inoperable.

As described below, the detection interconnection W includes the serpentine regions R1 to R3 disposed in locations where the serpentine regions R1 to R3 are easy to break (e.g., locations where cracking is prone to occur in the interconnect) and easier to break than normal. As a result, in a case where a signal interconnection is disconnected, the detection interconnection W is disconnected prior to the disconnection of the signal interconnection and the disconnection of the detection interconnection W serves as advance warning of disconnection of the signal interconnection.

A disconnection mechanism of the signal interconnection and the detection interconnection W will now be described.

As already described, when the semiconductor device 10 is mounted on the mounting substrate 60, the semiconductor device 10 is connected to the mounting substrate 60 by the solder joint portions 32.

When a heat stress is applied to the mounted semiconductor device 10, there is a probability that the interconnections in the interconnection substrate 20 are broken because of the heat stress. The memory chips 41 to 48 (formed from a semiconductor material such as silicon) and the mounting substrate 60 (formed from an insulating material) differ in the material and have a large difference therebetween in a coefficient of thermal expansion, so that a high stress is generated therebetween. The stress becomes higher particularly as the number of the memory chips becomes large (i.e., the thickness of the silicon layer becomes thicker).

This stress causes cracking in the interconnection substrate 20 in portions of the interconnection substrate 20 near the solder joint portions 32, often resulting in disconnection of the signal interconnection. When the signal interconnection are disconnected, then the semiconductor device 10 becomes inoperable and needs to be replaced by another. For example, an SSD (solid state drive) generally includes a plurality of semiconductor devices 10 in a memory package, and only the defective semiconductor device 10 is replaced when any one of the semiconductor devices 10 becomes inoperable.

However, after the signal interconnections are disconnected, it is difficult to read the data stored in the defective semiconductor device 10. Using the detection interconnection W makes it possible to detect the impending disconnection of the signal interconnection before the actual disconnection of the signal interconnection and to save the data before the actual disconnection of the signal interconnection, which makes the reading of the data semiconductor device 10 difficult or not possible.

The pads P1 and P2 are disposed in different locations from those of the signal pads P used for transmission and reception of signals. Normally, the signal pads P are concentrated in the vicinity of a center of the interconnection substrate 20. Because of this, the pads P1 and P2 are disposed closer to an outer periphery of the interconnection substrate 20 (i.e., in locations closer to ends of the memory chip 41) than a set of the signal pads P.

The pads P1 and P2 can be, however, disposed among the signal pads P if space is permitted.

The serpentine regions R1 to R3 are regions where the interconnection zigzags multiple times. A direction of the zigzags is preferably a direction from a central side of the interconnection substrate 20 to an outer peripheral side thereof. As described later, the heat stress is applied along the outer periphery of the interconnection substrate 20 and an outer periphery (edge) of the memory chip 41, and cracking and eventually breaking occur in the interconnection substrate 20 at the outer periphery. It is, therefore, preferable that the direction of the zigzags is the direction in which the interconnections in the serpentine regions R1 to R3 intersect the outer periphery of the interconnection substrate 20 and the outer periphery (edge) of the memory chip 41 (without being located along the outer peripheries of the interconnection substrate 20 and the memory chip 41).

While the direction of the zigzags of the interconnections in the serpentine regions R1 to R3 is orthogonal to the sides of the interconnection substrate 20 in this embodiment, the direction of the zigzags may be inclined with respect to the sides of the interconnection substrate 20.

As already described, the serpentine regions R1 to R3 are disposed in the locations where the serpentine regions R1 to R3 are prone to break, in the interconnection layer 24.

The serpentine region R1 is disposed in the location corresponding to a boundary between the interconnection substrate 20 and the memory chip 41, that is, the outer periphery (edge) of the memory chip 41, and strides across this outer periphery. Since the difference in the coefficient of thermal expansion is large between the interconnection substrate 20 and the memory chip 41 and the high stress is applied to the boundary therebetween, cracking is prone to occur in the interconnection substrate 20 (particularly in the insulating layer 21) at this location. This cracking causes the breaking of the signal interconnection in the interconnection layer 23. That is, the serpentine region R1 is intended to detect disconnections of the signal interconnection in the interconnection layer 23 in advance.

While the serpentine region R1 extends over a part of the signal pads P, in the illustrated embodiment, the serpentine region R1 is not required to extend over a part of the signal pads P.

In the serpentine region R1, the detection interconnection W is disposed to correspond to a part of the outer periphery of the memory chip 41. In this way, shaping the interconnection to zigzag along the locations where the stress is high and extending a length thereof can facilitate breaking a part of the detection interconnection W and improve detection sensitivity.

The detection interconnection W is preferably generally equal to or smaller in width than the signal interconnections in the semiconductor device 10. If the width of the detection interconnection W is smaller, the detection interconnection W is easier to break by the stress and the detection sensitivity can be improved. That is, for improving the sensitivity, it is preferable to reduce the width and distances between linear portions of the detection interconnection W in the serpentine region R1 (as well as the serpentine regions R2 and R3) (for example, to be equal to or smaller than about 35 μm, preferably equal to or smaller than about 30 μm). Furthermore, for improving the sensitivity, it is preferable to increase a width (for example, to be equal to or larger than about 1 mm, preferably equal to or larger than about 2 mm) and a length (for example, to be equal to or larger than about 1 mm, preferably equal to or larger than about 2 mm) of the serpentine region R1 (as well as the serpentine regions R2 and R3).

It is noted, however, when the signal interconnections are disposed on the interconnection layer 24, it is necessary to provide the detection interconnection W to avoid these signal interconnections.

The serpentine region R2 is disposed in the location corresponding to one of signal pads $P_o$ on an outermost periphery of the interconnection substrate 20. The pads $P_o$ correspond to the outermost circumferential pads among the plurality of third pads.

While a pad $P_p$ is disposed on the outer periphery of the interconnection substrate 20 outward of the pads $P_o$, the pad $P_p$ serves as a power supply (Vcc) pad and is, therefore, excluded from the outermost circumferential pads $P_o$. Generally, a power supply interconnection is thicker and more difficult to disconnect than the signal interconnections, so that the power supply interconnection may be excluded from targets for disconnection detection.

A stress is applied from each external terminal 31 to the interconnection substrate 20 due to a difference in thermal expansion between the interconnection substrate 20 and the mounting substrate 60. This stress tends to be higher as the external terminal 31 is closer to the outer periphery of the interconnection substrate 20. That is, there is a probability that cracking occurs in a region of the interconnection substrate 20 (particularly, the insulating layer 22) close to the external terminals 31 on the outermost circumference of the interconnection substrate 20 and that the signal interconnection in the interconnection layer 25 are disconnected. That is, the serpentine region R2 is provided to detect disconnections of the signal interconnection in the interconnection layer 25 in advance.

Here, the serpentine region R2 is disposed not only directly over the pad $P_o$ but also on the outer periphery of the memory chip 41 to further detect cracking in the insulating layer 21 (to predict breaking of signal interconnection in the interconnection layer 23).

While the serpentine region R2 is positioned above the pad $P_o$ to cover an entire outer periphery (edge) of the pad $P_o$, the serpentine region R2 may be positioned to cover only a part of the outer periphery of the pad $P_o$, for example, only an outer portion (outer edge) of the outer periphery thereof.

The serpentine region R3 is disposed in the location corresponding to the outer periphery of the memory chip 41 (boundary between the memory chip 41 and the interconnection substrate 20) and one of the outermost circumferential pads P. This pad P corresponds to the pad closest to the outer periphery of the memory chip 41 among the plurality of third pads.

In this location, there is a probability that high stresses are applied to the interconnection substrate 20 from both the memory chip 41 and the external terminal 31 connected to the outermost circumferential pad P and that breaking occurs in any of the insulating layers 21 and 22 (and thus interconnection layers 23 to 25).

In this way, the breaking is prone to occur in the location which is proximate to the outer periphery of the memory chip 41 and where the pad P is disposed, so that providing the serpentine region R3 is of significance.

As described so far, providing the pads P1 and P2 that are not connected to the signal interconnection and causing the detection interconnection W to connect the pads P1 and P2 to each other make it possible to detect cracking in the interconnection substrate 20 before the disconnection of the signal interconnection actually occurs. The serpentine regions R1 to R3 are disposed in the locations where cracking is prone to occur in the interconnections. It is thereby possible to detect cracking before the signal interconnection are actually disconnected, and to replace the semiconductor device 10 (for example, memory package) before the semiconductor device 10 becomes inoperable.

While the detection interconnection W is disposed in the interconnection layer 24 (which is the inner layer) in this embodiment, the detection interconnection W may be disposed in the interconnection layer 23 (which is the top layer) or in each of the interconnection layers 23 and 24. Furthermore, when a plurality of interconnection layers 24 are provided, the detection interconnection W can be disposed in at least one of the interconnection layers 24. In this case, providing the detection interconnection W (serpentine regions R1 to R3) in the lowermost interconnection layer 24 (closest to the interconnection layer 25) facilitates detecting a sign of breaking of the interconnection layer 25.

Modified Embodiment

Figure 4:
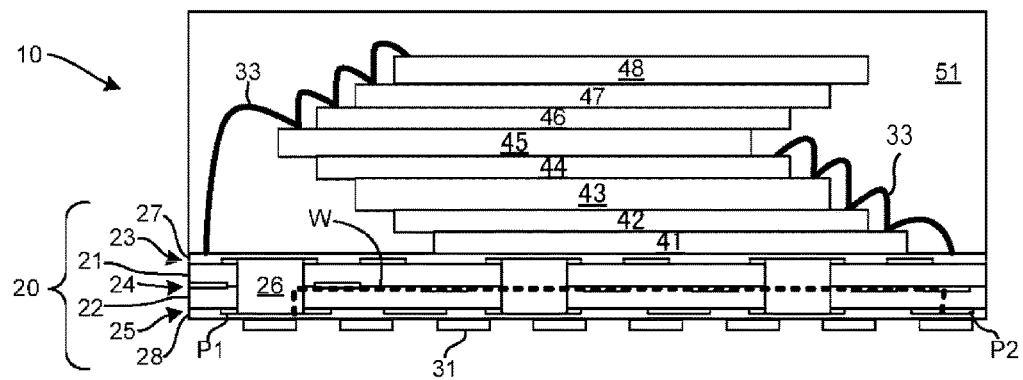
FIG. 4 is a cross-sectional view illustrating a semiconductor device according to a modified embodiment.

The semiconductor device 10 according to a modified embodiment will be described. FIG. 4 is a cross-sectional view illustrating a semiconductor device according to a modified embodiment. FIG. 5 is a cross-sectional view illustrating a state of mounting the semiconductor device according to the modified embodiment.

In this modified embodiment, the external terminals 31 of the semiconductor device 10 serve as an LGA (Land Grid Array) and heights of the solder joint portions 32 connecting the semiconductor device 10 to the mounting substrate 60 during mounting are small, compared with those of the preceding embodiment.

In the case of the BGA, the solder joint portions 32 possibly mitigate a stress between the semiconductor device 10 and the mounting substrate 60. In the modified embodiment, the stress between the semiconductor device 10 and the mounting substrate 60 is difficult to mitigate and cracking is prone to occur in the interconnection substrate 20. Furthermore, as shown in FIG. 5, the semiconductor device 10 using the LGA as in the modified embodiment does not include the underfill layer 52, so that cracking is prone to occur in the interconnection substrate 20, compared with the preceding embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a substrate including an insulating layer, a first conductive layer on a first surface of the insulating layer, a second conductive layer on a second surface of the insulating layer that is opposite to the first surface, a third conductive layer extending in a plane direction of the substrate along the first and second surfaces in the insulating layer, and a via extending in a thickness direction of the substrate in the insulating layer; and
   a semiconductor chip disposed on a first principal surface of the substrate above the first surface, wherein the substrate further includes:
   a planar detection interconnection provided as part of either the first conductive layer or the third conductive layer, wherein the planar detection interconnection is not part of signal interconnections that are used during operation of the semiconductor chip and is not electrically connected to any circuit of the semiconductor chip, and a width of the planar detection interconnection is smaller than a width of the signal interconnections; and
   first and second pads to be connected to part of a ball grid array (BGA) or a land grid array (LGA), the first and second pads provided as part of the second conductive layer and electrically connected to the planar detection interconnection through the via.

2. The semiconductor device according to claim 1, wherein
   the planar detection interconnection includes a serpentine region where the planar detection interconnection in the serpentine region is folded back and forth in a zigzag manner.

3. The semiconductor device according to claim 2, wherein
   the serpentine region is disposed at a location corresponding to a part of an outer periphery of the semiconductor chip.

4. The semiconductor device according to claim 2, wherein
   the second conductive layer further includes a plurality of third pads electrically connected to the semiconductor chip, and
   the serpentine region is disposed at a location corresponding to one of the third pads.

5. The semiconductor device according to claim 4, wherein
   the serpentine region is disposed at a location corresponding to one of the third pads provided on an outer side of the semiconductor chip.

6. The semiconductor device according to claim 5, wherein the planar detection interconnection in the serpentine region includes a plurality of linear portions and the linear portions extend perpendicular to the outer side of the semiconductor chip.

7. The semiconductor device according to claim 1, wherein
   the planar detection interconnection includes first and second serpentine regions where the planar detection interconnection in each of the first and second serpentine regions is folded back and forth in a zigzag manner.

8. The semiconductor device according to claim 1, wherein the planar detection interconnection in the first serpentine region includes a plurality of first linear portions that extend in a first direction and the planar detection interconnection in the second serpentine region includes a plurality of second linear portions that extend in a second direction crossing the first direction.

9. The semiconductor device according to claim 8, wherein the first and second directions are perpendicular to each other.

10. A semiconductor package, comprising:
a substrate including an insulating layer, a first conductive layer on a first surface of the insulating layer, a second conductive layer on a second surface of the insulating layer that is opposite to the first surface, a third conductive layer extending in a plane direction of the substrate along the first and second surfaces in the insulating layer, and a via extending in a thickness direction of the substrate in the insulating layer;
a plurality of semiconductor chips stacked on a first principal surface of the substrate above the first surface; and
a plurality of external terminals disposed on a second principal surface of the substrate opposite to the first principal surface, the plurality of external terminals being a ball grid array (BGA) or a land grid array (LGA), wherein the substrate further includes:
  signal interconnections provided as part of the first conductive layer and electrically connected to the semiconductor chips;
  a planar detection interconnection provided as part of either the first conductive layer or the third conductive layer, wherein the planar detection interconnection is not electrically connected to any of the signal interconnections, and a width of the planar detection interconnection is smaller than a width of the signal interconnections; and
  first and second pads connected to part of the external terminals, the first and second pads provided as part of the second conductive layer and electrically connected to the planar detection interconnection through the via.

11. The semiconductor package according to claim 10, wherein
  the planar detection interconnection includes a serpentine region where the planar detection interconnection in the serpentine region is folded back and forth in a zigzag manner.

12. The semiconductor package according to claim 11, wherein
  the serpentine region is disposed at a location corresponding to a part of an outer periphery of one of the semiconductor chips.

13. The semiconductor package according to claim 11, wherein
  the second conductive layer further includes a plurality of third pads electrically connected to the one of the semiconductor chips, and
  the serpentine region is disposed at a location corresponding to one of the third pads.

14. The semiconductor package according to claim 13, wherein
  the serpentine region is disposed at a location corresponding to one of the third pads provided on an outer side of the one of the semiconductor chips.

15. The semiconductor package according to claim 14, wherein the planar detection interconnection in the serpentine region includes a plurality of linear portions and the linear portions extend perpendicular to the outer side of the one of the semiconductor chips.

16. The semiconductor package according to claim 10, wherein
  the planar detection interconnection includes first and second serpentine regions where the planar detection interconnection in each of the first and second serpentine regions is folded back and forth in a zigzag manner.

17. The semiconductor package according to claim 10, wherein the planar detection interconnection in the first serpentine region includes a plurality of first linear portions that extend in a first direction and the planar detection interconnection in the second serpentine region includes a plurality of second linear portions that extend in a second direction crossing the first direction.

18. The semiconductor package according to claim 17, wherein the first and second directions are perpendicular to each other.

* * * * *